(12) United States Patent
Honda

(10) Patent No.: US 7,122,868 B2
(45) Date of Patent: Oct. 17, 2006

(54) SEMICONDUCTOR INTEGRATED CIRCUIT DEVICE

(75) Inventor: Takao Honda, Kanagawa (JP)

(73) Assignee: NEC Electronics Corp., Kanagawa (JP)

(*) Notice: Subject to any disclaimer, the term of this patent is extended or adjusted under 35 U.S.C. 154(b) by 59 days.

(21) Appl. No.: 10/781,001

(22) Filed: Feb. 18, 2004

(65) Prior Publication Data

US 2004/0159896 A1    Aug. 19, 2004

(30) Foreign Application Priority Data

Feb. 18, 2003    (JP) ............................. 2003-039623

(51) Int. Cl.
*H01L 29/72* (2006.01)
(52) U.S. Cl. ............. 257/391; 257/393; 365/189.05; 327/281; 326/83; 326/93
(58) Field of Classification Search ........ 257/391, 257/392; 365/233
See application file for complete search history.

(56) References Cited

U.S. PATENT DOCUMENTS 6,894,356 B1 * 5/2005 Choi ..................... 257/393

FOREIGN PATENT DOCUMENTS

JP    8-181596    7/1997

* cited by examiner

*Primary Examiner*—Edward Wojciechowicz
(74) *Attorney, Agent, or Firm*—Scully, Scott, Murphy & Presser, P.C.

(57) ABSTRACT

To provide a semiconductor integrated circuit device that reduces charging and discharging currents flowing through clock tree synthesis, thereby reducing current consumption of entire circuits of the semiconductor integrated circuit device.

In a semiconductor integrated circuit device including a clock synchronous type circuit that operates in synchronization with either of rising and falling edges flank of a reference clock and a plurality of clock buffer circuits for distributing the reference clock to the clock synchronous type circuit, each clock buffer circuit is constituted from a first transistor that drives a load at one of the edges flank of the reference clock with which the clock synchronous type circuit does not operate in synchronization and a second transistor that drives the load at the other edge flank of the reference clock. A gate width of the first transistor is set so that a change in the edge flank is slowed down, provided that a pulse waveform of the reference clock is not destroyed. A carrier type of the second transistor is different from the carrier type of the first transistor, and the second transistor is formed to have the gate width larger than the first transistor.

13 Claims, 9 Drawing Sheets

SEMICONDUCTOR INTEGRATED CIRCUIT DEVICE

FIELD OF THE INVENTION

The present invention relates to a semiconductor integrated circuit device. More specifically, the invention relates to the semiconductor integrated circuit device having a clock synchronous type circuit that operates in synchronization with either of a rising edge flank or a falling edge flank of a reference clock.

BACKGROUND OF THE INVENTION

When the clock synchronous type circuit including a plurality of flip-flops (that will be referred below as F/Fs) that operate in synchronization with the reference clock is formed in the semiconductor integrated circuit device such as an ASIC (Application Specific Integrated Circuit), the reference clock is supplied to each of the F/Fs using a plurality of clock buffer circuits for distributing the reference clock.

FIG. 7 is a circuit diagram showing a conventional clock buffer circuit provided for a semiconductor integrated circuit device, and FIG. 8 is a timing diagram showing input and output waveforms for the clock buffer circuit shown in FIG. 7. FIG. 9 is a circuit diagram showing a configuration of clock tree synthesis using the clock buffer circuit shown in FIG. 7.

As shown in FIG. 7, the conventional clock buffer circuit includes a first inverter 5 and a second inverter 6. The first inverter 5 is constituted from a P-channel field-effect transistor (that will be referred below as a P-channel transistor) 51 and an N-channel field-effect transistor (that will be referred below as an N-channel transistor) 52. Gates of the P-channel transistor 51 and the N-channel transistor 52 are interconnected, and drains of the P-channel transistor 51 and the N-channel transistor 52 are interconnected. The P-channel transistor 51 and the N-channel transistor 52 use different types of carriers in channels. The reference clock is input to the respective gates of the P-channel transistor 51 and the N-channel transistor 52. The second inverter 6 for driving a load is constituted from a P-channel transistor 61 and an N-channel transistor 62. The gates of the P-channel transistor 61 and the N-channel transistor 62 are interconnected, and the drains of the P-channel transistor 61 and the N-channel transistor 62 are interconnected. Sources of the P-channel transistors 51 and 61 are connected respectively to a power supply VDD, while the sources of the N-channel transistors 52 and 62 are connected respectively to a ground potential GND.

Since the conventional clock buffer circuit is based on an assumption that the clock buffer circuit is for general-purpose use in a device such as the ASIC, the clock buffer circuit outputs a waveform that is the same as the input reference clock so as to accommodate both the clock synchronous type circuit that operates in synchronization with the rising edge flank of the reference clock and the clock synchronous type circuit that operates in synchronization with the falling edge flank of the reference clock. When the reference clock with a duty cycle of 50% has been input, for example, the clock buffer circuit outputs a pulse train with the duty cycle of 50% having substantially same delays in rise and fall times and with the rising and falling edges flank that are the same as those of an input waveform.

For this reason, in the conventional clock buffer circuit, the P-channel transistor of each of the inverters is formed to be larger than the N-channel transistor. In other words, the P-channel transistor is formed to have a gate width wider than the N-channel transistor. More specifically, as shown in FIG. 7, the first inverter 5 in a front stage is formed of the P-channel transistor 51 having a gate width Wp of 8.472 μm and the N-channel transistor 52 having a gate width Wn of 2.82 μm, while the second inverter 6 in a back stage is formed of the P-channel transistor 61 having the gate width Wp of 16.944 μm and the N-channel transistor 62 having the gate width Wn of 6.24 μm. A transistor size ratio Wp/Wn of the first inverter 5 then becomes 3.00, while the transistor size ratio of Wp/Wn of the second inverter 6 becomes 2.72. This arrangement is adopted because when a transistor size is the same, the P-channel transistor has lower driving capability than the N-channel transistor.

In the conventional semiconductor integrated circuit device, the clock tree synthesis as shown in FIG. 9, which will be referred to below as CTS, was performed using a clock buffer circuit 50 described above. The clock having same duty ratio and skew is thereby distributed to a plurality of F/Fs provided for the clock synchronous type circuit. FIG. 9 shows an example where posedege F/Fs 60 that operate at the rising edge flank of the reference clock are connected to the CTS.

Patent document 1, for example, proposes a configuration in which the transistor size ratio of the P-channel transistor and the N-channel transistor in a CMOS circuit is made asymmetrical in order to transmit a signal through the semiconductor integrated circuit device at high speed.

[Patent Document 1]
JP Patent Kokai Publication No. JP-A-8-181596

SUMMARY OF THE DISCLOSURE

Since the semiconductor integrated circuit device in recent years is also employed in cellular phones and mobile terminals such as a PDA, reduction in power consumption, together with faster processing are more increasingly demanded.

However, in the conventional semiconductor integrated circuit as described above, the P-channel transistor in the clock buffer circuit is formed to be larger (usually on the order of two or three times larger) than the N-channel transistor, a gate capacity of the P-channel transistor increases. An input capacity of the clock buffer circuit thus increases.

Accordingly, when the above-mentioned CTS is performed using the conventional clock circuit, the clock buffer circuit having the larger input capacity becomes the load for the clock buffer circuit in its preceding stage. A number of the clock buffer circuits that can be connected as loads is therefore restricted, resulting in an increase in the number of the clock buffer circuits constituting the CTS. For this reason, charging and discharging currents that passes through the CTS in response to switching operations using the reference clock increase. Thus, a problem has arisen that the entire semiconductor integrated circuit device consumes much more current.

In a case of the clock synchronous type circuit that operates in synchronization with either of the rising edge flank or the falling edge flank of the reference clock, in particular, when the CTS is performed using the conventional clock buffer circuit, the circuit in its subsequent stage will be driven by the P-channel transistor of a large size at an unnecessary edge flank of the reference clock. Thus, a problem has arisen that the CTS consumes more current than is necessary.

The present invention has been made to solve the problems with the conventional art, as described above. It is therefore an object of the invention to provide a semiconductor integrated circuit device that reduces charging and consumed in CTS, thereby reducing current consumption throughout entire circuits of the semiconductor integrated circuit device.

In order to achieve the object described above, there is provided a semiconductor integrated circuit device according to the present invention, i.e., a semiconductor integrated circuit device including a clock synchronous type circuit that operates in synchronization with one of a rising edge flank and a falling edge flank of a reference clock and a plurality of clock buffer circuits for distributing the reference clock to the clock synchronous type circuit.

In the device, each of the clock buffer circuits comprises an inverter which includes:

a first transistor for driving a load at one of the edges flank of the reference clock with which the clock synchronous type circuit does not operate in synchronization; and a second transistor for driving the load at the other edge flank of the reference clock with which the clock synchronous type circuit operates in synchronization, the type of carriers used in a channel for the second transistor being different from the carrier type of the first transistor and the second transistor being formed to have a gate width larger than the first transistor.

Then, it is preferable that the first transistor is a P-channel field-effect transistor, the second transistor is an N-channel field-effect transistor, and the clock synchronous type circuit operates in synchronization with the falling edge flank of the reference clock. Further it is preferred that the gate width of the first transistor is set so that a change in the edge flank is slowed down provided that the pulse waveform of the reference clock is not destroyed.

The semiconductor integrated circuit device according to the present invention may comprise:

a first-stage inverter displaced in the input stage of each of the clock buffer circuits, the first-stage inverter comprising:

the N-channel field-effect transistor having the gate width set properly based on the input capacity of the inverter; and the P-channel field-effect transistor having the gate width larger than the N-channel field-effect transistor. Alternatively, the semiconductor integrated circuit device may comprise:

a gate circuit displaced in the input stage of each of the clock buffer circuits, for supplying the reference clock to the inverter according to an enable signal, the gate circuit comprising:

the N-channel field-effect transistor having the gate width set properly based on the input capacity of the inverter; and the P-channel field-effect transistor having the gate width larger than the N-channel field-effect transistor.

The semiconductor integrated circuit device according to the present invention may have clock tree synthesis constituted using the clock buffer circuits.

In the semiconductor integrated circuit device configured as described above, the clock buffer circuit includes the inverter: the inverter includes the first transistor that drives the load at either of the edges flank of the reference clock with which the clock synchronous type circuit does not operate in synchronization and has the gate width that has been set so that a change in the edge flank is slowed down, provided that the pulse waveform of the reference clock is not destroyed, and the second transistor that drives the load at the other edge flank of the reference clock with which the clock synchronous type circuit operates in synchronization. The type of carriers used the channel of the second transistor is different from the carrier type of the first transistor, and the second transistor is formed to have the gate width larger than the first transistor. Since a size of the first transistor thus can be more reduced than in a prior art, the input capacity of the inverter can be thereby reduced.

PREFERRED EMBODIMENTS OF THE INVENTION

Next, the preferred embodiments of the present invention will be described with reference to drawings.

(First Embodiment)

Figure 1:
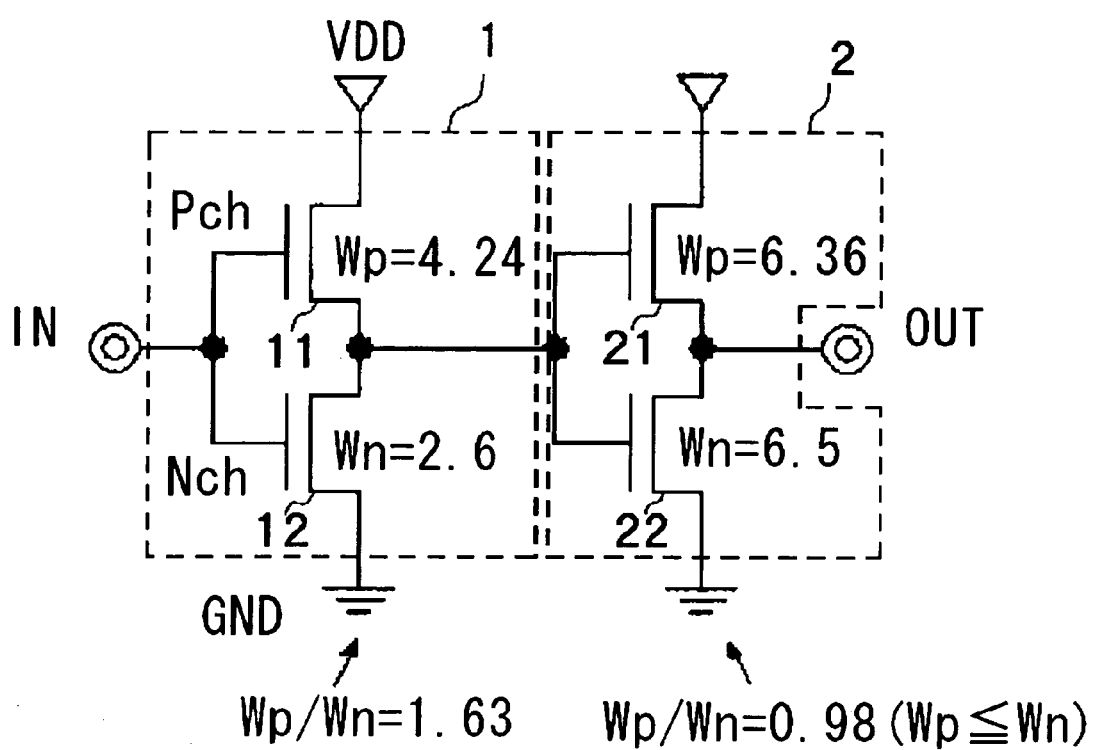
FIG. 1 is a circuit diagram showing a configuration of a clock buffer circuit of a semiconductor integrated circuit device according to a first embodiment of the present invention.
Figure 2:
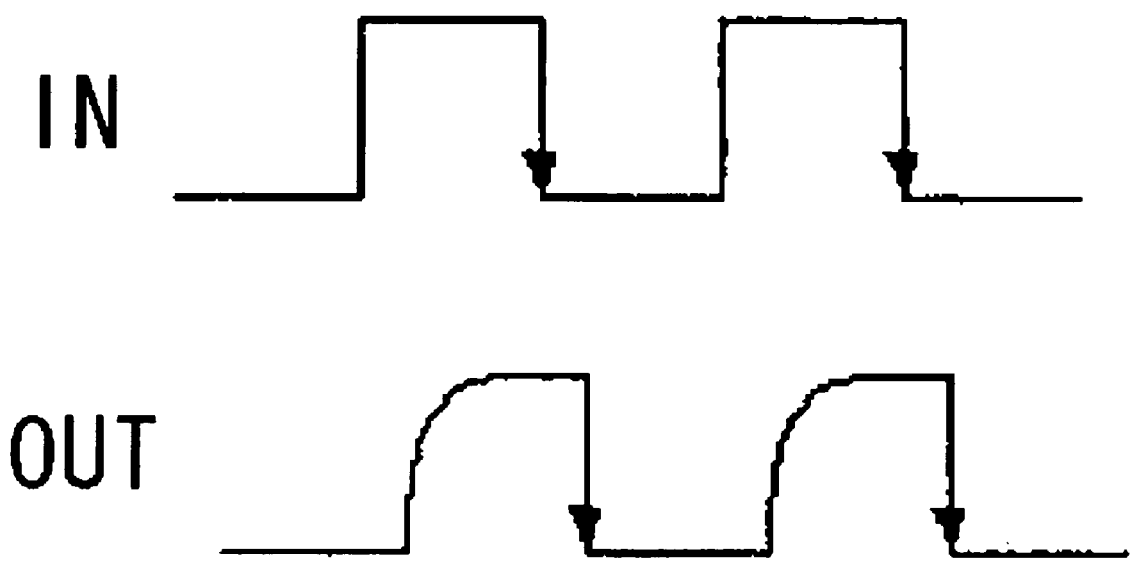
FIG. 2 is a timing diagram showing input and output waveforms of the clock buffer circuit shown in FIG. 1.
Figure 3:
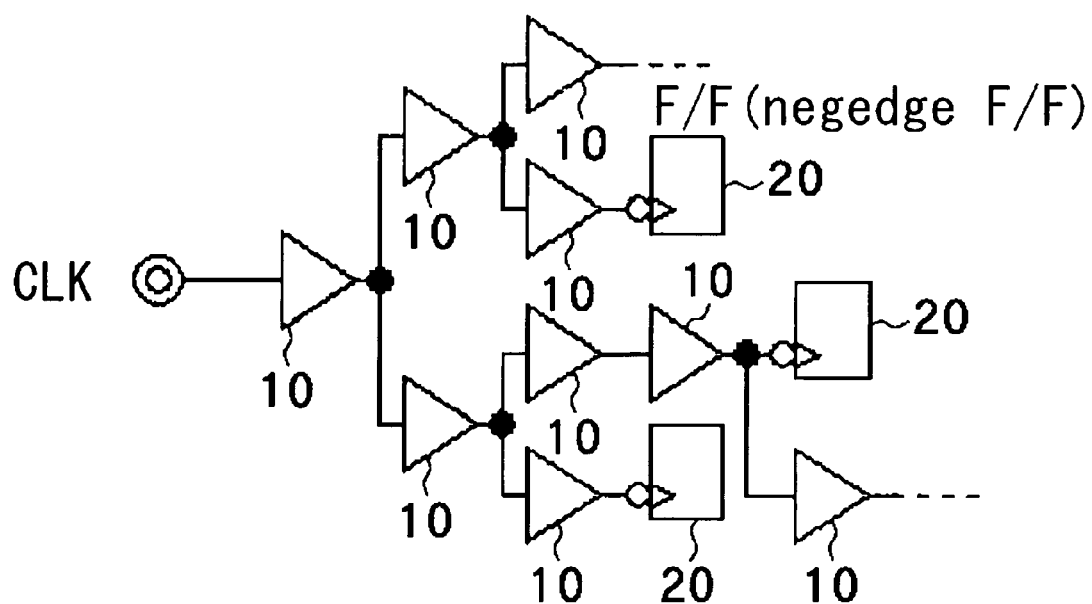
FIG. 3 is a circuit diagram showing a configuration of clock tree synthesis using the clock buffer circuit in FIG. 1.

FIG. 1 is a circuit diagram showing a configuration of a clock buffer circuit provided for a semiconductor integrated circuit device according to a first embodiment of the present invention. FIG. 2 is a timing diagram showing input and output waveforms of the clock buffer circuit shown in FIG. 1. FIG. 3 is a circuit diagram showing a configuration of clock tree synthesis using the clock buffer circuit shown in FIG. 1.

The clock buffer circuit in this embodiment is configured to be applied to a clock synchronous type circuit that operates in synchronization with either of a rising edge flank or a falling edge flank of a reference clock. Each of clock buffer circuits constituting the CTS is configured to reduce its input capacity by reducing a size of a transistor for performing driving at the edge flank of the reference clock that is not used for a synchronizing operation.

As shown in FIG. 1, like a conventional clock buffer circuit, the clock buffer circuit in the first embodiment includes a first inverter 1 and a second inverter 2. The first inverter 1 is constituted from a P-channel transistor 11 and an N-channel transistor 12. Gates of the P-channel transistor 11 and the N-channel transistor 12 are interconnected, drains of the P-channel transistor 11 and the N-channel transistor 12 are interconnected, and the reference clock is input to the respective gates of the P-channel transistor 11 and N-channel transistor 12. The second inverter 2 is constituted from a P-channel transistor 21 and an N-channel transistor 22. The gates of the P-channel transistor 21 and the N-channel transistor 22 are interconnected, the drains of the P-channel transistor 21 and the N-channel transistor 22 are interconnected, and the second inverter 2 drives a load. Sources of the P-channel transistors 11 and 21 are connected respectively to a power supply VDD, while the sources of the N-channel transistors 12 and 22 are connected respectively to a ground potential GND.

Generally, in the clock synchronous type circuit that operates in synchronization with either of the rising edge flank of the falling edge flank of the reference clock, even if the rising edge flank or the falling edge flank that is not used for the synchronizing operation does not change abruptly, an operation of the circuit is not affected. Accordingly, the rising edge flank or the falling edge flank that is not used for the synchronizing operation can be slowed down, (or a rise time or a fall time can be prolonged), provided that a waveform of the reference clock is not destroyed by passing through a plurality of gate circuits (clock buffers).

The clock buffer circuit in this embodiment outputs pulses having rising edges flank with a slowed down transition and falling edges flank changing abruptly like the falling edges flank of conventional pulses, as shown in FIG. 2, provided that the clock buffer circuit in this embodiment is employed in the clock synchronous type circuit that operates in synchronization with the falling edge flank alone.

For this reason, in the clock buffer circuit in this embodiment, the size of the P-channel transistor 21 in the second inverter 2, which drives the load at the rising edge flank that is not used for the synchronizing operation is reduced, and the size of the N-channel transistor 22 that drives the load at the falling edge flank used for the synchronizing operation is made to be about the same as a conventional N-channel transistor. The respective sizes of the P-channel transistor 11 and the N-channel transistor 12 in the first inverter 1 are reduced to match the reduction in the size of the P-channel transistor 21 in the second inverter 2. More specifically, gate widths of the respective transistors in the first inverter 1 are set properly based on the input capacity of the second inverter 2, and a gate width Wp of the P-channel transistor 11 is formed to be wider than a gate width Wn of the N-channel transistor 12 (Wp>Wn). In the second inverter 2 disposed in the subsequent stage, the gate width Wp of the P-channel transistor 21 is formed to be equal to or less than the gate width Wn of the N-channel transistor 22 (Wp≦Wn). Then, a lower limit value of the gate width Wp of the P-channel transistor 21 is set to be a value that does not cause pulse destruction described above.

More specifically, as shown in FIG. 1, the first inverter 1 is formed of the P-channel transistor 11 having a gate width Wp of 4.24 μm and the N-channel transistor 12 having a gate width Wn of 2.6 μm. The second inverter 2 is formed of the P-channel transistor 2.1 having a gate width Wp of 6.36 μm and the N-channel transistor 22 having a gate width Wn of 6.5 μm. Then, a transistor size ratio Wp/Wn of the first inverter 1 becomes 1.63, and the transistor size ratio Wp/Wn of the second inverter 2 becomes 0.98.

In this embodiment, using clock buffer circuits 10 each made up of these two inverters, the CTS as shown in FIG. 3 is constituted. As shown in FIG. 3, in this embodiment, for use in the clock synchronous type circuit that operates in synchronization with the falling edge flank alone, negedge F/Fs 20 that operate at the falling edge flank of a clock are connected to the CTS. The clock having its delay and skew adjusted based on the falling edge flank of the reference clock is respectively supplied to these F/Fs from the CTS.

According to the semiconductor integrated circuit device in this embodiment, by reducing the size of the P-channel transistor of the inverter in a final stage in the clock buffer circuit, (which is the second inverter in this embodiment), a load capacity to be driven by the inverter in its preceding stage, (which is the first inverter in this embodiment), is reduced. Thus, the sizes of the transistors in the inverter in the preceding stage can be correspondingly reduced. The input capacity of the clock buffer circuit can be thereby reduced. Then, by constituting the CTS using the clock buffer circuit of this type, the load capacities to be driven by the preceding-stage clock buffer circuits decrease. Thus, the number of the clock buffer circuits can be more reduced than in a conventional CTS. Accordingly, charging and discharging currents resulting from switching operations of the CTS are reduced, so that current consumption of the CTS is reduced.

The CTS has a highest operating rate among circuits formed in the semiconductor integrated circuit device, and the number of clock buffer circuits used for the CTS becomes equal to or larger than several hundreds. Accordingly, the charging and discharging currents resulting from the switching operations of the CTS commands a large share of the current consumption of entire circuits of the semiconductor integrated circuit device. Hence, if the current consumption of the CTS is reduced as in this embodiment, the current consumption of the entire semiconductor integrated circuit device can be greatly reduced.

Furthermore, by reducing the sizes of the transistors in each of the inverters in the clock buffer circuit, the current consumption of the clock buffer circuit itself can be reduced, and a layout area can also be reduced.

If this embodiment is applied to a CPU core manufactured using a design rule with a gate length of 160 nm, results as shown in Table 1 were obtained.

TABLE 1

| | Clock Buffer of Present Invention | Conventional Clock Buffer | Reduction Rate | Remarks |
|---|---|---|---|---|
| Layout Area [μm × μm] | 6.72 × 5.04 (12 Grid) | 8.4 × 5.04 (15 Grid) | 80[%] (−3 Grid) | |
| Input Capacity [pF] | 0.00974 | 0.016 | 60.8[%] | |
| Single Unit Power (1 Toggle) [mW] | 0.102 | 0.167 | 61.4[%] | Input Waveform Slack: 0.01 [nS], Output Load: at 0.005 [pF] |
| Number of CTS Used [Unit] | 311 | 548 | 56.8[%] | |
| CTS Power (100 MHz) [mW] (For Reference) | 8.11 | 10.9 | 74.2[%] | |
| Clock Buffer Delay (rise) [nS] | 0.350 | 0.236 | 148.3[%] | Slack Input Waveform: 0.4 [nS], Output Load: at 0.3 [pF] |
| Clock Buffer Delay (fall) [nS] | 0.230 | 0.224 | 102.7[%] | |

(Second Embodiment)

Figure 4:
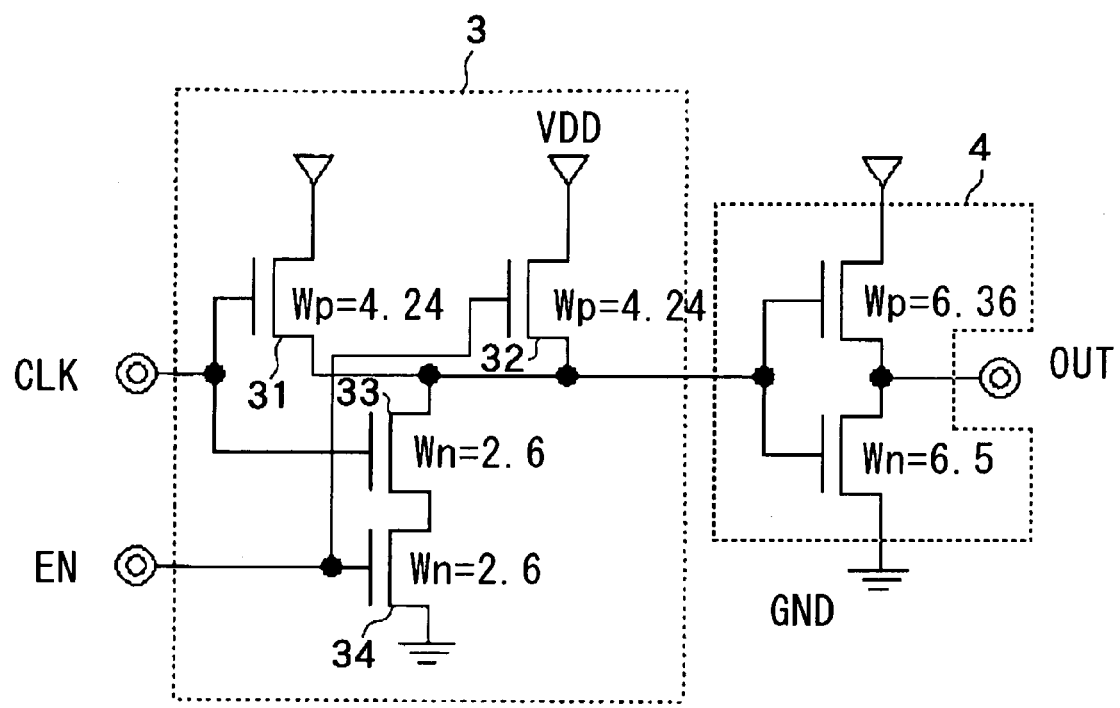
FIG. 4 is a circuit diagram in showing a configuration of a clock buffer circuit of a semiconductor integrated circuit device according to a second embodiment of the present invention.
Figure 5:
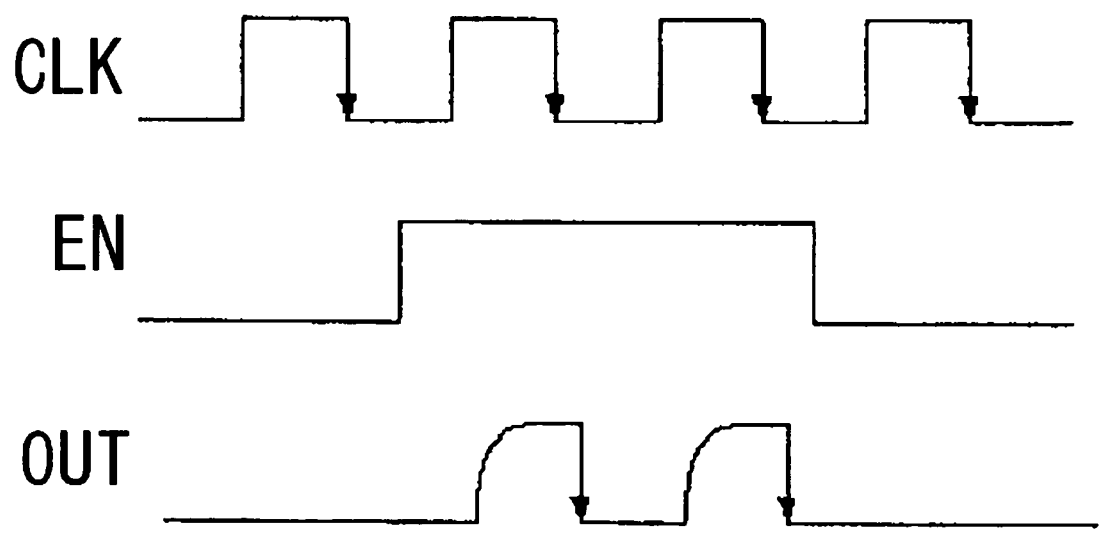
FIG. 5 is a timing diagram showing input and output waveforms of the clock buffer circuit shown in FIG. 4.
Figure 6:
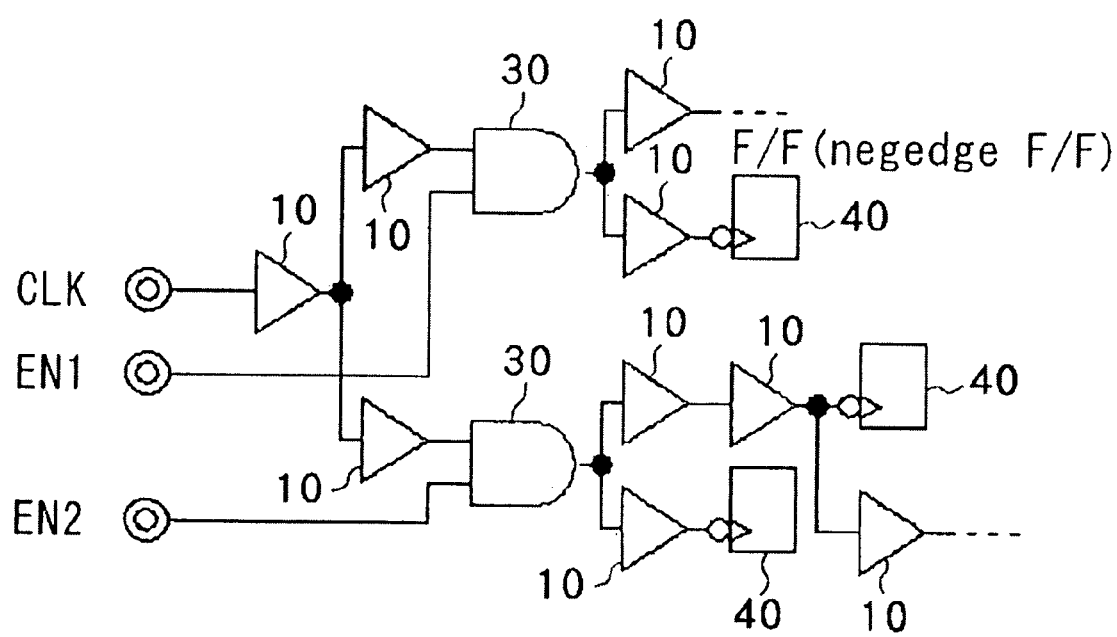
FIG. 6 is a circuit diagram showing a configuration of clock tree synthesis using the clock buffer circuit shown in FIG. 4.
Figure 7:
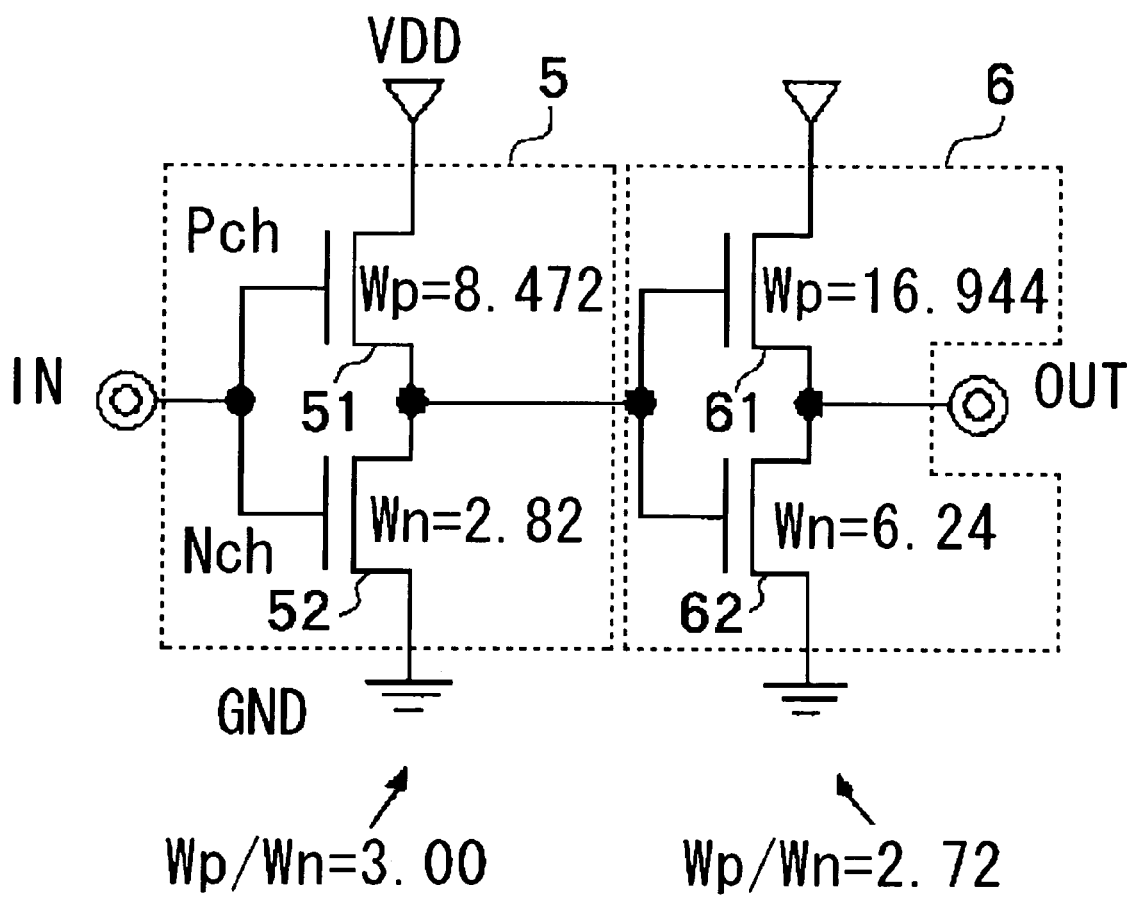
FIG. 7 is a circuit diagram showing a configuration of a clock buffer circuit of a conventional semiconductor integrated circuit device.
Figure 8:
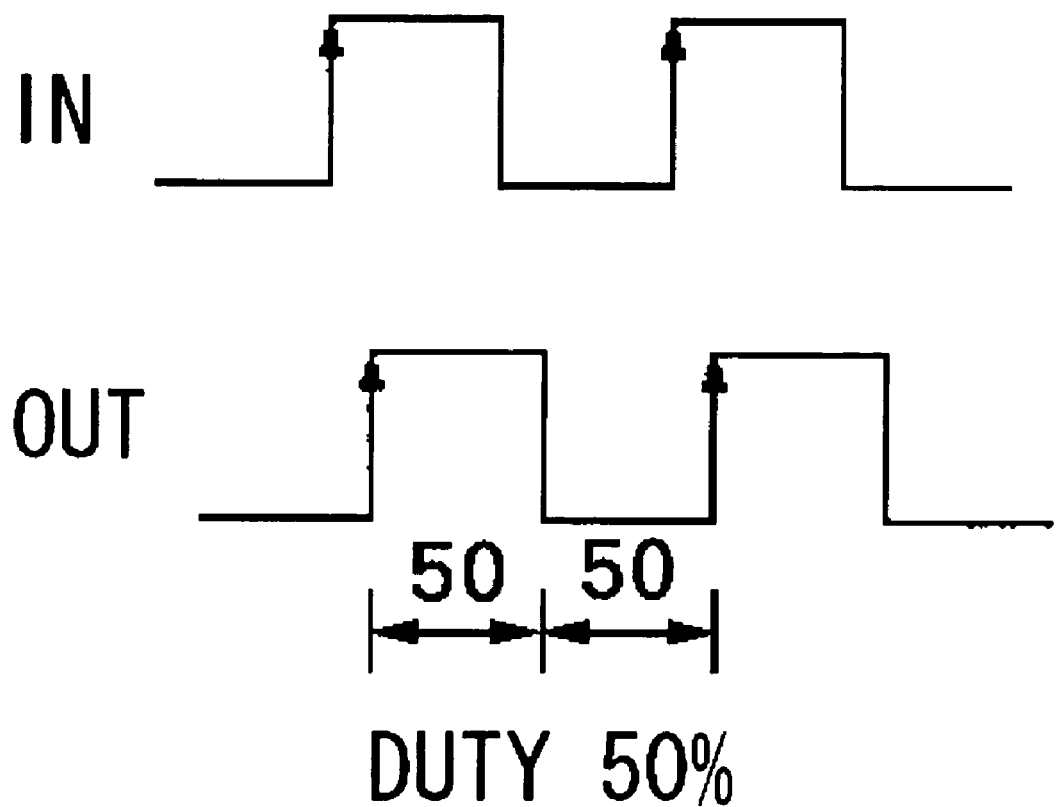
FIG. 8 is a timing diagram showing input and output waveforms of the clock buffer circuit shown in FIG. 7.
Figure 9:
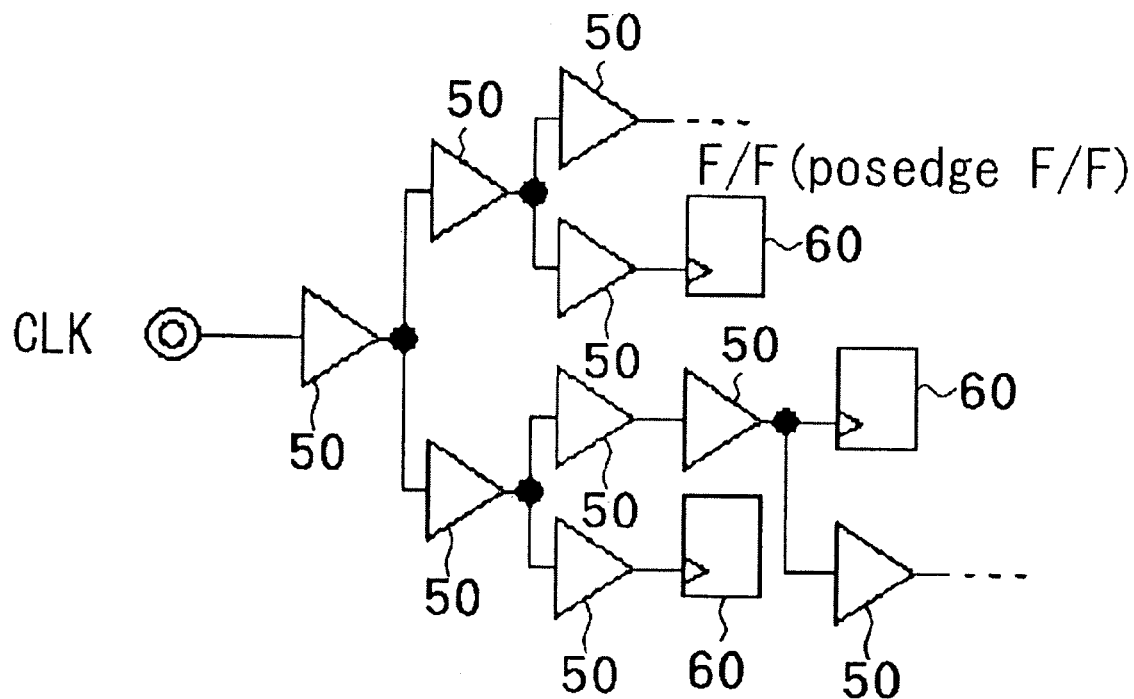
FIG. 9 is a circuit diagram showing a configuration of clock tree synthesis using the clock buffer circuit shown in FIG. 7.

FIG. 4 is a circuit diagram showing a configuration of a clock buffer circuit provided for a semiconductor integrated circuit device according to a second embodiment of the present invention. FIG. 5 is a timing diagram showing input and output waveforms of the clock buffer circuit shown in FIG. 4. FIG. 6 is a circuit diagram showing a configuration of a clock tree synthesis configuration using the clock buffer circuit shown in FIG. 4.

The clock buffer circuit in the second embodiment is configured to include a NAND gate 3 in place of the first inverter, as shown in FIG. 4.

As shown in FIG. 4, the NAND gate 3 includes a first P-channel transistor 31, a first N-channel transistor 33, a second P-channel transistor 32, and a second N-channel transistor 34. The gates of the first P-channel transistor 31 and the first N-channel transistor 33 are interconnected, and the drains of the first P-channel transistor 31 and the first N-channel transistor 33 are interconnected. A reference clock CLK is input to the gates of the first P-channel transistor 31 and the first N-channel transistor 33. The drains of the first P-channel transistor 31, the first N-channel transistor 33, and the second P-channel transistor 32 are interconnected, and an enable signal EN is input to the gate of the second P-channel transistor 32. The drain of the second N-channel transistor 34 is connected to the source of the first N-channel transistor 33, and the gates of the second P-channel transistor 32 and the second N-channel transistor 34 are interconnected. The source of the first P-channel transistor 31 and the source of the second P-channel transistor 32 are respectively connected to the power supply VDD, and the source of the second N-channel transistor 34 is connected to the ground potential GND. Herein, an example was shown where an input stage of the clock buffer circuit was replaced from the inverter by the NAND gate 3. An NOR gate or the like rather than the NAND gate can constitute a similar circuit.

Output of the clock buffer circuit in the second embodiment is configured to be controlled by the enable signal EN. When the reference clock with the duty cycle of 50% was input, for example, the clock buffer circuit in this embodiment outputs the pulse train in which the rising edges flank have been slowed down and the falling edges flank have been abruptly changed as in the prior art while the enable signal EN is "High", as shown in FIG. 5. While the enable signal EN is at "Low", the output is fixed at "Low", as shown in FIG. 5.

In the clock buffer circuit in this embodiment, in regard to the first P-channel transistor 31 and the second P-channel transistor 32, and the first N-channel transistor 33 and the second N-channel transistor 34 of the NAND gate 3, the gate width Wp of the first P-channel transistor 31 and the second P-channel transistor 32 is formed to be wider than the gate width Wn of the first N-channel transistor 33 and the second N-channel transistor 34 (Wp>Wn), as in the conventional clock buffer circuit. The gate widths of these transistors are however, properly set based on the input capacity of the inverter 4 in the subsequent stage, as in the first embodiment.

More specifically, the gate width Wp of the first and second P-channel transistors is formed to be 4.24 μm, and the gate width Wn of the first and second N-channel transistors is formed to be 2.6 μm, as shown in FIG. 4. The transistor size ratio Wp/Wn of the NAND gate then becomes 1.63 (refer to FIG. 4).

In the inverter 4 in the subsequent stage, the gate width Wp of the P-channel transistors is formed to be equal to or less than the gate width Wn of the N-channel transistors (Wp≦Wn), as in the second inverter in the first embodiment. The lower limit value of the gate width Wp of the p-channel transistors is then set to the value that does not cause problems such as the pulse destruction and the like.

In this embodiment, using clock buffer circuits 30 each constituted from the NAND gate 3 and the inverter 4 and the clock buffer circuits 10 in the first embodiment, the CTS is constituted, as shown in FIG. 6. FIG. 6 shows an example of a circuit of two control signals comprising a first clock enable signal EN1 and a second clock enable signal EN2. Furthermore, the clock buffer circuit in this embodiment is also employed in the clock synchronous circuit that operates in synchronization with the falling edges flank alone, the negative edges (negedges) F/Fs 40 that operate at the falling edges flank of the clock are connected to the CTS. The clock of which the delay and the skew have been adjusted based on the falling edge flank of the reference clock is supplied from the CTS, respectively.

According to the semiconductor integrated circuit device in this embodiment, even if output of the clock buffer circuit is controlled by the clock enable signal, its input capacity can be reduced, as in the first embodiment, and by constituting the CTS using the clock buffer circuit, current consumptions of the CTS and the entire semiconductor integrated circuit device can be reduced. The current consumption of the clock buffer circuit is also reduced, and its layout area is also reduced.

In the first and second embodiments, an example was shown where the clock buffer circuit of the present invention is employed in the clock synchronous circuit that operates in synchronization with the falling edge flank. The present invention can also be employed in the clock synchronous type circuit that operates in synchronization with the rising edge flank. In this case, the inverters and the NAND gate may be configured using the large P-channel transistors like those in the prior art and the N-channel transistors smaller than those in the prior art. However, as described above, if the sizes of the P-channel transistor and the N-channel transistor are identical, the N-channel transistor has higher load driving capability than the P-channel transistor. Thus, the sizes of the transistors can be made smaller if the subsequent stage is abruptly driven by the N-channel transistor. Thus, it is preferable that the clock buffer circuit of the present invention is employed in the clock synchronous type circuit that operates in synchronization with the falling edge flank, because by doing so, effects of reducing the current consumption and the layout area can be more appreciably obtained.

The meritorious effects of the present invention are summarized as follows.

Since the present invention is configured as described above, following effects can be achieved.

The clock buffer circuit includes the inverter: the inverter includes the first transistor that drives the load at either of edges flank of the reference clock with which the clock synchronous type circuit does not operate in synchronization and has the gate width that has been set so that a change in the edge flank is slowed down, provided that the pulse waveform of the reference clock is not destroyed, and the second transistor that drives the load at the other edge flank of the reference clock with which the clock synchronous type circuit operates in synchronization. The type of carriers flowing through the channel of the second transistor is different from the carrier type of the first transistor, and the second transistor is formed to have the gate width larger than the first transistor. The input capacity of the inverter can be thereby reduced.

Thus, a load capacity of a first-stage inverter disposed in the input stage of the clock buffer circuit or the load capacity to be driven by the gate circuit is reduced. For this reason, since sizes of the transistors in the first-stage inverter or the gate circuit can also be reduced to match the reduction, the input capacity of the clock buffer circuit can be reduced. Then, by constituting the clock tree synthesis using this clock buffer circuit, the load capacity to be driven by the clock buffer circuit in a front stage is reduced. Thus, a number of clock buffer circuits can be more reduced than in a conventional clock tree synthesis. Accordingly, charging and discharging currents resulting from switching operations of the clock tree synthesis are reduced, so that current consumption of the clock tree synthesis is reduced.

Further, when the current consumption of the clock tree synthesis is reduced, the current consumption of the entire semiconductor integrated circuit device can be greatly reduced.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device including a clock synchronous type circuit that operates in synchronization with one of a rising edge and a falling edge of a reference clock and a plurality of clock buffer circuits for distributing a reference clock to said clock synchronous circuit, wherein each of said clock buffer circuits comprises an inverter including:
   a first transistor of a first conductivity type for driving a load at one edge of the reference clock when said clock synchronous circuit does not operate in synchronization; and
   a second transistor of a second conductivity type for driving the load at the other edge of the reference clock when said clock synchronous circuit operates in synchronization, the second transistor having a current supply ability larger than the first transistor.

2. The semiconductor integrated circuit device according to claim 1, wherein the first transistor is a P-channel field-effect transistor; the second transistor is an N-channel field-effect transistor; and said clock synchronous circuit operates in synchronization with the falling edge flank of the reference clock.

3. The semiconductor integrated circuit device according to claim 1, wherein said first transistor has a gate width set to a gate width value that produces a change in the edge flank that is slowed down, and the gate width value being selected so that a pulse waveform of the reference clock is not destroyed.

4. The semiconductor integrated circuit device according to claim 1, comprising: a first-stage inverter displaced in an input stage of said each of said clock buffer circuits, the first-stage inverter comprising:
   an N-channel field-effect transistor having a gate width set properly based on an input capacity of the inverter; and
   an P-channel field-effect transistor having a gate width larger than the N-channel field-effect transistor.

5. The semiconductor integrated circuit device according to claim 2, comprising: a first-stage inverter displaced in an input stage of said each of said clock buffer circuits, the first-stage inverter comprising:
   an N-channel field-effect transistor having a gate width set properly based on an input capacity of the inverter; and
   an P-channel field-effect transistor having a gate width larger than the N-channel field-effect transistor.

6. The semiconductor integrated circuit device according to claim 1, comprising: a gate circuit displaced in an input stage of said each of said clock buffer circuits, for supplying the reference clock to the inverter according to an enable signal, the gate circuit comprising:
   an N-channel field-effect transistor having the gate width set properly based on an input capacity of the inverter; and
   an P-channel field-effect transistor having the gate width larger than the N-channel field-effect transistor.

7. The semiconductor integrated circuit device according to claim 2 comprising: a gate circuit displaced in an input stage of said each of said clock buffer circuits, for supplying the reference clock to the inverter according to an enable signal, the gate circuit comprising:
   an N-channel field-effect transistor having the gate width set properly based on an input capacity of the inverter; and
   an P-channel field-effect transistor having the gate width larger than the N-channel field-effect transistor.

8. The semiconductor integrated circuit device according to claim 6, wherein the gate circuit is a NAND gate.

9. The semiconductor integrated circuit device according to claim 1, having a clock tree synthesis configuration made up using said clock buffer circuits.

10. The semiconductor integrated circuit device according to claim 1, wherein said first transistor is connected between a first voltage supply line and an output terminal to be connected to said clock synchronous circuit, and said second transistor is connected between a second voltage supply line and an output terminal.

11. A semiconductor integrated circuit device including a clock buffer, said clock buffer comprising:
   a first transistor having a first conductivity type and a first current supply ability, said first transistor being connected between a first voltage supply line and an output terminal to be connected to a clock synchronous type circuit, said clock synchronous type circuit operating in synchronization with one of either a rising edge and a falling edge; and
   a second transistor having a second conductivity type and a second current supply ability, said second transistor being connected between a second voltage supply line and said output terminal to be connected to said clock synchronous type circuit, said second current supply ability being smaller than said first current supply ability.

12. The device according to claim 11, wherein said first transistor is an N-channel transistor and said second transistor is a P-channel transistor.

13. The device according to claim 11, wherein said first transistor has a gate width larger than a gate width of said second transistor.

* * * * *